United States Patent
Pengelly et al.

(10) Patent No.: US 6,791,417 B2
(45) Date of Patent: Sep. 14, 2004

(54) N-WAY RF POWER AMPLIFIER CIRCUIT WITH INCREASED BACK-OFF CAPABILITY AND POWER ADDED EFFICIENCY USING SELECTED PHASE LENGTHS AND OUTPUT IMPEDANCES

(75) Inventors: Raymond Sydney Pengelly, Hillsborough, NC (US); Simon Maurice Wood, Sunnyvale, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 0 days.

(21) Appl. No.: 10/430,568

(22) Filed: May 5, 2003

(65) Prior Publication Data

US 2003/0210096 A1 Nov. 13, 2003

Related U.S. Application Data

(63) Continuation-in-part of application No. 10/059,866, filed on Jan. 28, 2002.

(51) Int. Cl.$^7$ .............................. H03F 3/68; H03F 3/60
(52) U.S. Cl. .................... 330/295; 330/124 R; 330/286
(58) Field of Search ............................ 330/295, 124 R, 330/286

(56) References Cited

U.S. PATENT DOCUMENTS

| | | | |
|---|---|---|---|
| 3,579,136 A | | 5/1971 | Machamer |
| 5,420,541 A | * | 5/1995 | Upton et al. ................ 330/286 |
| 5,757,229 A | * | 5/1998 | Mitzlaff ................... 330/124 R |
| 5,786,727 A | * | 7/1998 | Sigmon ................... 330/124 R |
| 5,966,059 A | * | 10/1999 | Sigmon ....................... 333/128 |
| 6,097,252 A | | 8/2000 | Sigmon et al. |
| 6,262,629 B1 | * | 7/2001 | Stengel et al. .......... 330/124 R |
| 6,374,092 B1 | | 4/2002 | Leizerovich et al. |
| 6,396,341 B1 | | 5/2002 | Pehlke |
| 6,445,247 B1 | | 9/2002 | Walker |
| 6,448,616 B1 | | 9/2002 | Perugupalli et al. |

OTHER PUBLICATIONS

"The Dougherty Amplifier Product Review," Product Brochure, circa 1937.

* cited by examiner

*Primary Examiner*—Patricia Nguyen
(74) *Attorney, Agent, or Firm*—Beyer Weaver & Thomas, LLP

(57) ABSTRACT

An RF power amplifier circuit for amplifying an RF signal over a broad range of power with improved efficiency includes a carrier amplifier for amplifying an RF signal over a first range of power and with a power saturation level below the maximum of the broad range of power is disclosed. A plurality of peak amplifiers are connected in parallel with the carrier amplifier with each of the peak amplifiers being biased to sequentially provide an amplified output signal after the carrier amplifier approaches saturation. The input signal is applied through a signal splitter to the carrier amplifier and the plurality of peak amplifiers, and an output for receiving amplified output signals from the carrier amplifier and the plurality of peak amplifiers includes a resistive load R/2. The split input signal is applied through a 90° transformer to the carrier amplifier, and the outputs of the peak amplifiers are applied through 90° transformers to a output load. When operating below saturation, the carrier amplifier delivers power to a load of 2R and the carrier amplifier delivers current to the load, which is one-half the current at maximum power when the amplifier is saturated. In one embodiment with the output having an impedance, Z, the carrier amplifier and each peak amplifier is connected to the output through an output-matching network presenting an output impedance of less than Z to each amplifier and with each output-matching network having selected phase length to reduce reactance of the output impedance.

13 Claims, 6 Drawing Sheets

Condition for Peak Output Power

Condition for Low Input Power

PAE and Pout after modification

Performance of 180W Doherty amplifier
matched to 50 Ohm

\* PAE at 7dB back-off is 29%; 9dB back-off is 20%

\* Proper Doherty operation not seen with 180 watt amplifier designed
with 50 ohm nominal output impedances in carrier and peaking
amplifiers Performance of Doherty Amplifier
matched to 17 Ohm

*PAE at 7 dB back-off is 34%; 9 dB back-off is 25%
*PAE increased by 5% compared to Doherty matched to 50 Ohm Performance of Doherty Amplifier
matched to 10 Ohm

*PAE at 7 dB back-off is 34%; 9dB back-off is 27% and shows
stronger Doherty Operation

*PAE at 9dB back-off increased by 2% compared with Doherty
matched to 17 Ohm

N-WAY RF POWER AMPLIFIER CIRCUIT WITH INCREASED BACK-OFF CAPABILITY AND POWER ADDED EFFICIENCY USING SELECTED PHASE LENGTHS AND OUTPUT IMPEDANCES

CROSS-REFERENCE TO RELATED APPLICATIONS

This application is a continuation-in-part of U.S. patent application Ser. No. 10/059,866, filed Jan. 28, 2002, and entitled "N-Way RF Power Amplifier with Increased Back-off Power and Power Added Efficiency," the disclosure of which is hereby incorporated herein by reference in its entirety.

This application is related to U.S. patent application Ser. No. 10/430,461, filed May 5, 2003, and entitled "N-Way RF Power Amplifier Circuit with Increased Back-Off Capability and Power Added Efficiency Using Unequal Input Power Division," the disclosure of which is hereby incorporated herein by reference in its entirety.

BACKGROUND OF THE INVENTION

This invention relates generally to RF power amplifiers, and more particularly the invention relates to an RF power amplifier circuit suitable for modem wireless communication systems, which require a wide range of output power in basestations where digital modulation is being employed.

Power amplifiers in basestations often operate at output power levels much lower than peak power. Unfortunately, the back-off power level reduces the efficiency of the power amplifier in the transmitter. In a conventional amplifier there is a direct relationship between efficiency and the input drive level. Therefore, high efficiency (DC to RF conversion efficiency) is not obtained until the RF input power level becomes sufficiently high to drive the amplifier into compression or saturation. Since in multicarrier communication systems an amplifier must remain as linear as possible, this region of high efficiency cannot be used.

A power amplifier circuit design which provides improved efficiency in back-off power levels is the Doherty amplifier circuit, which combines power from a main or carrier amplifier and from an auxiliary or peak amplifier. See, W. H. Doherty, "A New High-Efficiency Power Amplifier for Modulated Waves," Proc. IRE Vol. 24, No. 9, pp. 1163–1182, 1936. In the conventional Doherty configuration, the carrier amplifier 10 and peak amplifier 12 are designed to deliver maximum power with optimum efficiency to a load R, as shown in FIG. 1A. The main or carrier amplifier is a normal Class B amplifier, while the peak amplifier is designed to only amplify signals which exceed some minimum threshold. For an LDMOS power transistor, this can be accomplished by DC biasing the transistor below its pinch-off voltage for operation similar to Class C. The outputs of the two amplifiers are connected by a quarter-wave transmission line of characteristic impedance R, and a load of one-half of the optimum load R is attached to the output of the peak amplifier. The RF input power is divided equally with a quarter-wave delay at the input to the peak amplifier, thus assuring that the output power of the two amplifiers at the load R/2 will be in phase.

The Doherty amplifier circuit achieves high efficiency prior to compression by operating the Class B carrier amplifier into an apparent load impedance two times larger than its optimum load. (Before the peak amplifier becomes active, the apparent load impedance presented to the carrier amplifier is 2R due to the presence of quarter wave transformer 14.) Thus, the carrier amplifier compresses and reaches peak efficiency at half of its maximum power. The second or peak amplifier becomes active only during the peaks of the input signal. When the peak amplifier is active, the load impedance apparent at the output of the carrier amplifier is reduced. Maximum efficiency is again achieved when the second amplifier puts out its full power. Thus, the first amplifier is kept on the verge of saturation for a 6 dB range of output power and near peak efficiency can be maintained.

When the input RF power into the Doherty amplifier circuit is not sufficient to turn on the peak amplifier, all of the output power is supplied by the main or carrier amplifier. When the peak amplifier is off, its output impedance is very high and the output power of the carrier amplifier is entirely delivered to load R/2, as shown in FIG. 1B. As discussed above, the load actually presented to the carrier amplifier across the quarter-wave transformer 14 is 2R. The device current is therefore one-half of what is delivered at maximum power while the voltage is saturated. This results in the device delivering half its maximum output power. Since both the RF and DC components of the current are half their peak values, the efficiency will be at its maximum with half of the maximum output power of the carrier amplifier being supplied to the load with maximum linear efficiency.

When sufficient input RF power is provided to allow the peak amplifier to become saturated, as in FIG. 1A, two parallel amplifiers are evenly delivering maximum output power to the load R/2. The load apparent to each amplifier is then the optimum load R, and the load at both ends of the quarter-wave transformer will remain at R. The peak amplifier is designed to begin operation when the carrier amplifier just begins to saturate. Maximum linear efficiency is obtained at this point. As the input RF drive is further increased, the peak amplifier begins to turn on and deliver output power to the load. The additional current supplied by the peak amplifier has the effect of increasing the load impedance at the output of the quarter-wave transformer. The effective change at the carrier amplifier end of the transformer will be a reduction in the apparent load impedance and enabling the carrier amplifier to deliver more power while its voltage remains saturated. The efficiency between the limits will fall off only slightly from the maximum since the duty factor of the peak amplifier is relatively low.

Attempts have been made to extend the range of high efficiency operation of the Doherty amplifier circuit. For example, Iwamoto et al. have produced a 12 dB back-off circuit using scaled transistors or different sized transistors in the carrier and peak amplifiers and an unequal power splitter at the input. See, Iwamoto et al., "An Extended Doherty Amplifier with High Efficiency Over a Wide Power Range," 2001 IEEE MTT-S Digest, Phoenix, Ariz. This technique apparently works well when the total output power is low (less than 1 watt), but with limited improvement when the output power is in the 10 to 100 watt CW range.

There continues to be a need to extend the range of high efficiency operation for an RF power amplifier.

BRIEF SUMMARY OF THE INVENTION

In accordance with the invention, an RF power amplifier circuit includes a main or carrier amplifier for maximum back-off power operation and one or more auxiliary or peak amplifiers which are suitably biased to begin operation sequentially at increased input power levels. Each peak amplifier can provide an increase of 6 dB in the power range over which the peak efficiency will be maintained. Since an N-way splitter is required for providing an input signal to the carrier amplifier and N−1 peak amplifiers, a finite loss of power in the splitter may limit some of the improvements in efficiency that can be realized. However, the use of peak amplifiers in high input power conditions may improve the overall efficiency of the circuit.

In one embodiment, a four-way amplifier circuit is provided and includes a carrier amplifier and three peak amplifiers all driven by a four-way power splitter. Theoretically, this amplifier may extend the range of efficient power by 18 dB. Such extension in efficient power range is very important in digital communication systems using modulation schemes such as wideband CDMA (W-CDMA) or OFDM where the peak to average power ratios can be as high as 13 dB. The four-way configuration also provides an overall power increase of 3 dBm compared to a two-way amplifier arrangement. Thus a 120 watt peak amplifier can be provided by a four-way arrangement with each amplifier path (a carrier and three peak amplifiers) utilizing 30 watt transistors.

In accordance with another embodiment of the invention, the individual load impedances and relative phases of the carrier and a peak amplifier are optimized to increase the effectiveness of the power amplifier circuit. In a practical amplifier circuit where the output impedance of the peak amplifier loads the output impedance of the carrier amplifier, the output power, gain and efficiency of the Doherty arrangement can be compromised. By introducing additional phase lengths between the output of the carrier amplifier and the Doherty combiner node as well as between the peak amplifier and the combiner node, it is possible to adjust the impedance as seen by either the carrier or peak amplifiers over a range of RF signal power levels to be closer to the ideal real portion of the impedance required for optimum performance.

The invention and objects and features thereof will be more readily apparent from the following detailed description and appended claims when taken with the drawings.

DETAILED DESCRIPTION OF THE INVENTION

The invention can be regarded as a modification of the Doherty power amplifier with the addition of one or more peak amplifiers and the provision of an N-way splitter for the main carrier amplifier and N−1 peak amplifiers. In order to ease the practical construction of the amplifier circuit, the Doherty amplifier quarter-wave transformers on the input to the peak amplifier and on the output of the carrier amplifier may be swapped, without affecting performance. However, in that case it will be appreciated by those skilled in the art that the impedance matching networks for the amplifiers should be adjusted to account for the relocation of the quarter-wave transformers. Only one single 90° (quarter-wave) phase length is needed on the carrier amplifier input, thus allowing easier implementation of multiple peak amplifiers through a multi-way power divider.

Figure 1A:
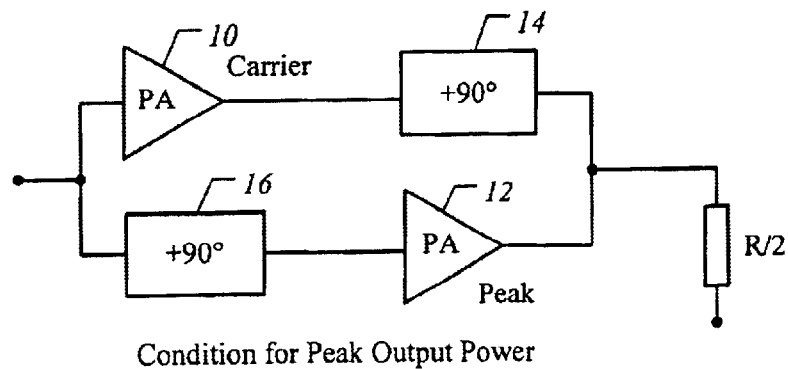
FIGS. 1A and 1B are schematics of a conventional Doherty amplifier circuit.
Figure 1B:
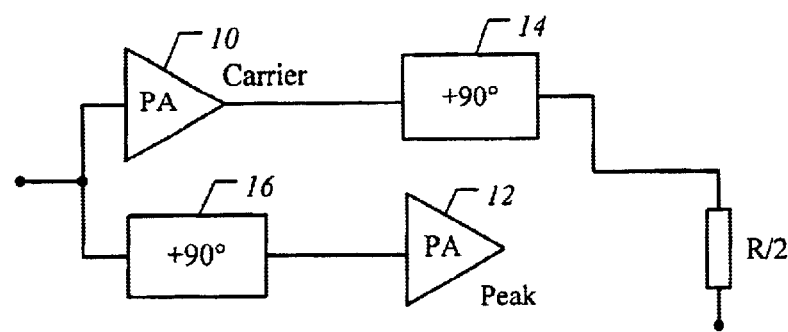
Figure 2:
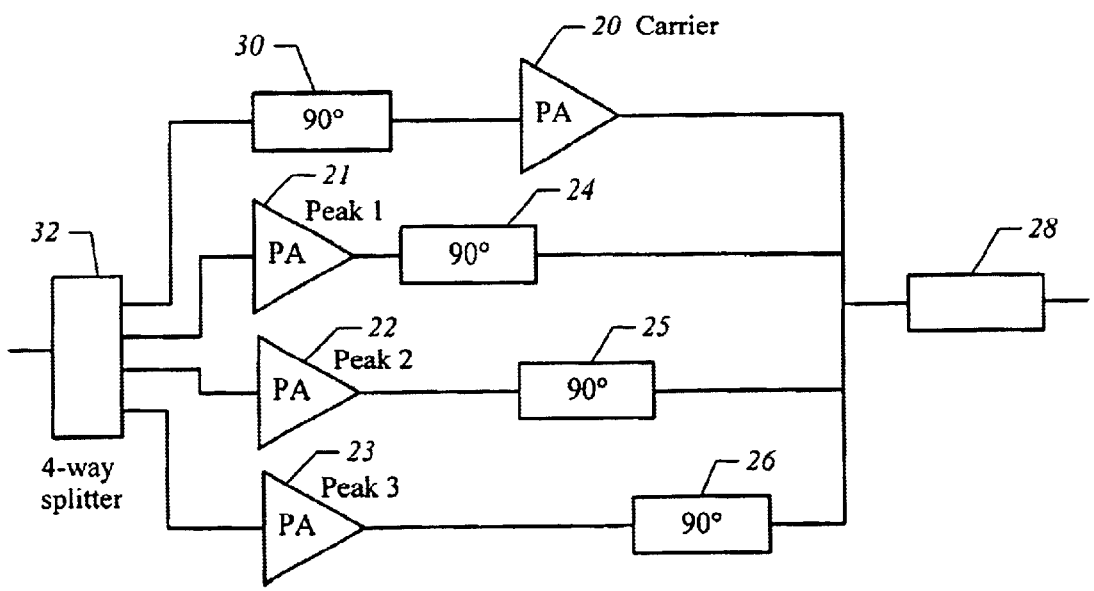
FIG. 2 is a schematic of a four-way power amplifier in accordance with embodiments of the invention.

FIG. 2 is a functional block diagram of one embodiment of a power amplifier in accordance with an aspect of the invention, which includes a carrier amplifier 20 and the three peak amplifiers 21, 22, 23, with the peak amplifiers connected through 90° transformers 24, 25, 26 to output load 28. A single 90° transformer 30 connects a four-way splitter 32 to carrier 20. By setting the DC bias on each of the peak amplifiers to appropriate values, the added peak amplifiers allow the Doherty action to be extended. The outputs of carrier amplifier 20 and peak amplifiers 21, 22, 23 are combined at combining node 27. For each peak amplifier that is added above the first, there will be a corresponding increase of 6 dB in the power range over which the peak efficiency will be maintained. Some limitation in efficiency will result due to the finite loss in the N-way splitter. The four-way amplifier extends the range of efficient power to a theoretical value of 18 dB. As noted above, such extension is very important in digital communication systems using modulation schemes where the peak to average power ratios can be as high as 13 dB. The four-way configuration provides an overall power increase of 3 dBm compared to a two-way Doherty amplifier circuit. Thus, a 120 watt peak amplifier can be provided by a four-way Doherty arrangement with each path (a carrier and three peak amplifiers) utilizing 30 watt transistors.

Figure 3:
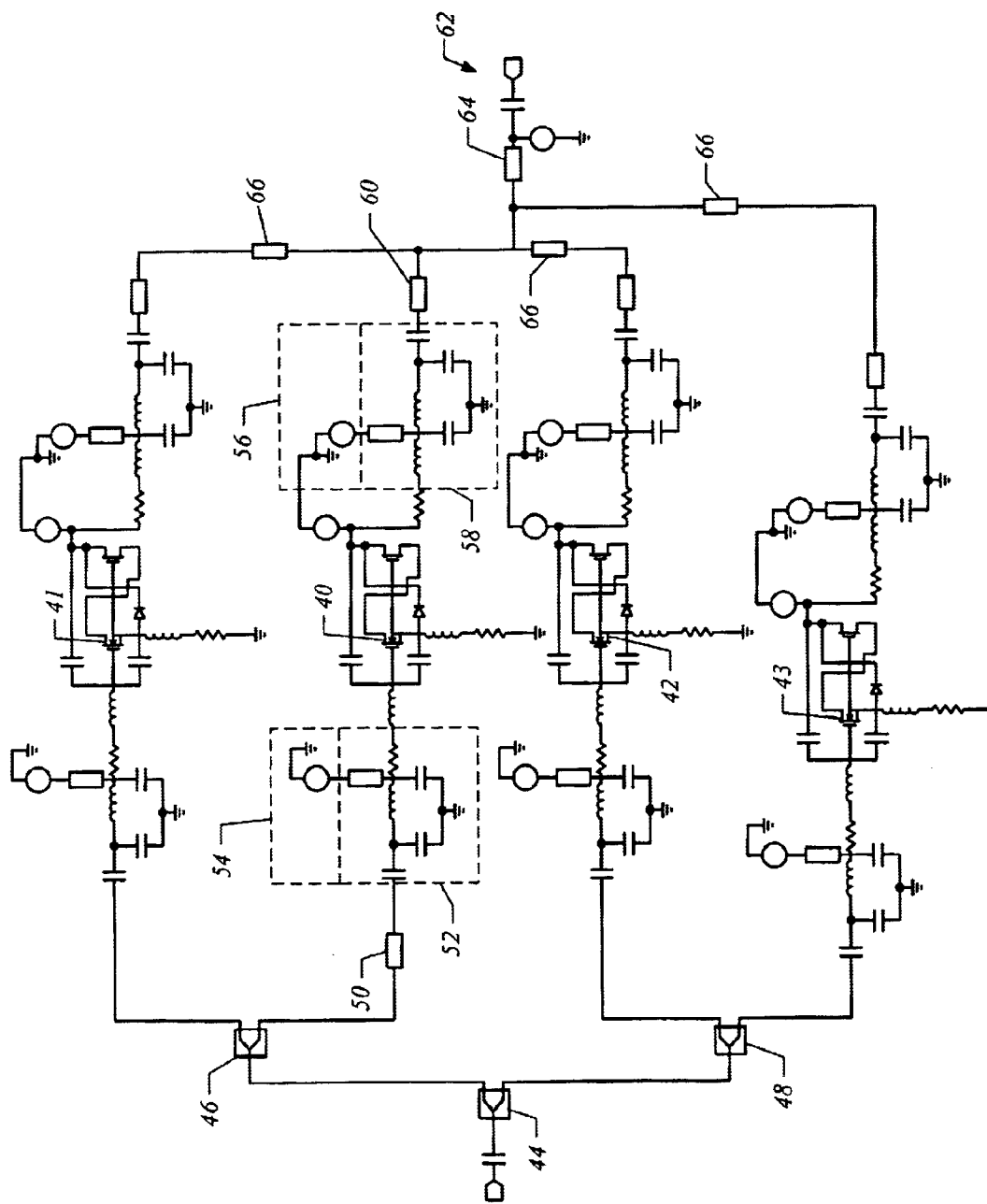
FIG. 3 is a more detailed schematic of a four-way amplifier in accordance with FIG. 2.

FIG. 3 is a more detailed schematic of an amplifier in accordance with FIG. 2 which has been simulated using 30 watt LDMOSFET power transistors from CREE Microwave, Inc., including a carrier amplifier transistor 40 and three peak amplifier transistors 41, 42, 43. Four-way splitting of the input signals is provided by two-way splitters 44, 46, and 48. Carrier amplifier transistor 40 includes a 90° transformer 50 which connects splitter 46 to input matching circuit 52. Gate bias 54, drain bias 56, an output matching circuit 58, and an offset microstrip phase length 60 serially connect the amplifier between phase splitter 46 and the output at 62 including a transformer 64 and resistive load 65. Each of the peak amplifiers has a 90° transformer 66 connecting the amplifier circuitry to the load, as shown in FIG. 2. A harmonic termination, e.g., grounded inductor and capacitor, can be included in output matching circuit 58 to reflect output harmonics back into the transistor output and hence increase peak efficiency. Each of the peak amplifier circuits has similar input and output circuits with the gate bias circuits providing sequential operation of the peak amplifiers as input signal strength increases.

Figure 4:
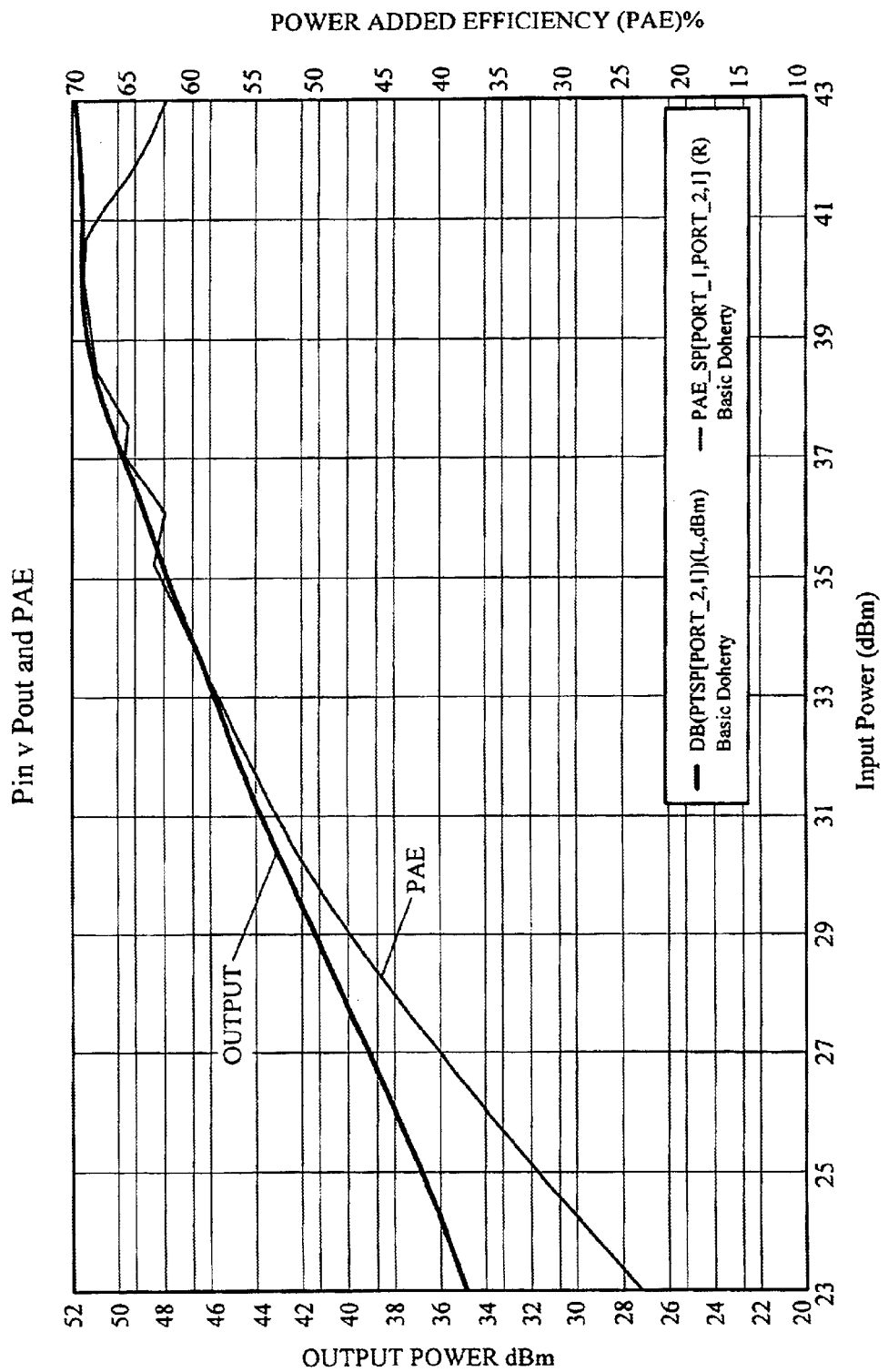
FIG. 4 is a graph illustrating power-out versus power-in and power added efficiency for a simulated power amplifier according to FIGS. 2 and 3.

The four-way amplifier circuit of FIG. 3 was simulated using an Applied Wave Research Microwave Office Simulator over the UMTS band (2110 to 2170 MHz) for output power, power added efficiency (PAE), and gain. FIG. 4 shows input RF power versus output RF power, as well as PAE over a range of input powers extending from 23 to 43 dBm (200 milliwatts to 20 watts) with a saturated output close to 150 watts (52 dBm). When the output power level is backed off to 42 dBm (10 dB back-off) the PAE is 46%. A conventional (i.e. non-Doherty) amplifier circuit would have a PAE of less than 10% for the same back-off power. A two-way Doherty amplifier circuit may have a corresponding PAE of 23%. It is important in the selection of the bias voltages for the peak amplifiers that the transistors turn on sequentially at the correct points to maintain gain linearity over the full dynamic range of the amplifier.

Table 1 shows a comparison between a conventional two-way Doherty amplifier circuit, a two-way Doherty amplifier circuit with unequal power split as described by Iwamoto et al., a three-way (a carrier amplifier with two peak amplifiers) in accordance with an embodiment of the invention, and a four-way split (a carrier amplifier with three peak amplifiers). It will be noted that the four-way amplifier achieves improvement in PAE at 10 dB back-off by a factor of about 2 over a 2-way Doherty approach.

the output of carrier amplifier 70 is connected through transmission lines 74, 76 each having an impedance of Z1, Z2 and a phase lengths of X1 and 90 degrees respectively, to a combiner node 80. The output of peak amplifier 72 is connected through transmission line 78 of impedance Z3 and phase length X3 degrees to combiner node 80. Node 80 is then connected through a transmission line transformer 82 of impedance Z4 and phase 90 degrees to the output node 84 with the impedance of node 84 being 50 ohms.

At low RF power drive, the carrier amplifier wants to see 100 ohms so that it can deliver half its normal output power at the 6 dB break point. However, the impedance is not 100 ohms because of parasitic loading from the peak amplifier. Similarly, at high RF power drive, the peak amplifier wants to see 25 ohms. However, the parasitic loading from the carrier amplifier increases the impedance seen by the peak amplifier. This can be illustrated on Smith charts with the

TABLE 1

| Configuration | SS Gain, dB | P1dB, dBm | PAE @ P1dB, % | PAE @ 7 dB back-off, % | PAB @ 10 dB back-off, % | Circuit Complexity |
|---|---|---|---|---|---|---|
| 180 watt two-way Doherty with unequal power split | 13.5 | 52 | 65 | 31.5 | 20.3 | Medium |
| 3 × 60 watt two-way Doherty with selected phase lengths | 11 | 53.2 | 55 | 32 | 23 | High |
| 2 × 90 watts three-way Doherty | 11 | 52.4 | 62 | 45 | 35 | High |
| 2 × 120 watt four-way Doherty | 11 | 53.9 | 63 | 52 | 44 | High |

An N-way Doherty amplifier circuit in accordance with embodiments of the invention gives major improvements in power added efficiency for linear power amplifiers over a wide range of input/output power levels. The amplifier may be particularly suitable for high power amplifiers because the power requirement of each transistor is inversely proportional to the number of power transistors N. In a two-way Doherty configuration, the peak power requirement of each transistor is forced to be one-half of the total output power. Such a condition leads to very low input and output impedances for the carrier and peak amplifiers and leads to practical realization difficulties. In an N-way Doherty amplifier circuit, each transistor needs to have a peak power requirement of 1/N output power, thus leading to higher input and output impedances when N is greater than 2. In addition, the heat generated by the remaining inefficiency in the amplifier is distributed over a larger physical area due to the use of smaller individual transistors, thus reducing total thermal resistance.

As noted above, in a practical amplifier where the output impedance of the peak amplifier loads the output impedance of the carrier amplifier, the output power, gain and efficiency of the Doherty arrangement can be compromised. In accordance with the invention, by introducing additional phase lengths between the output of the carrier amplifier and the combiner node as well as between the peak amplifier and the combiner node, it is possible to adjust the impedance as seen by either the carrier or peak amplifiers over a range of RF signal power levels to be closer to the ideal real impedance required for optimum performance. For example, at low signal levels in a 50 ohm Doherty arrangement, the carrier amplifier wants to see 100 ohms resistance, while at higher power levels, the peak amplifier wants to see 25 ohms resistance. This is illustrated schematically in FIG. 5 where reactance of the output impedance increasing the load above the real or in phase portion of the impedance. In accordance with the invention, the correct load impedance for the carrier amplifier at low RF signal levels is achieved by adjusting the phase length of the output of the carrier amplifier, and the correct load impedance for the peak amplifier at high RF signal levels is achieved by adjusting the phase length at the output of the peak amplifier. This will tend to reduce or eliminate the reactance portion of the impedance.

Figure 5:
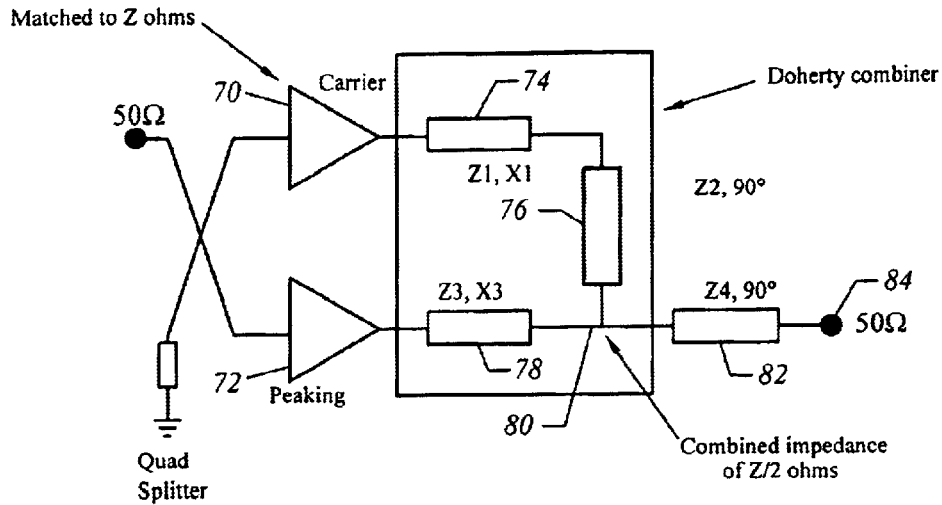
FIG. 5 is a schematic of a two-way Doherty amplifier circuit having additional phase lengths of arbitrary impedance.
Figure 6A:
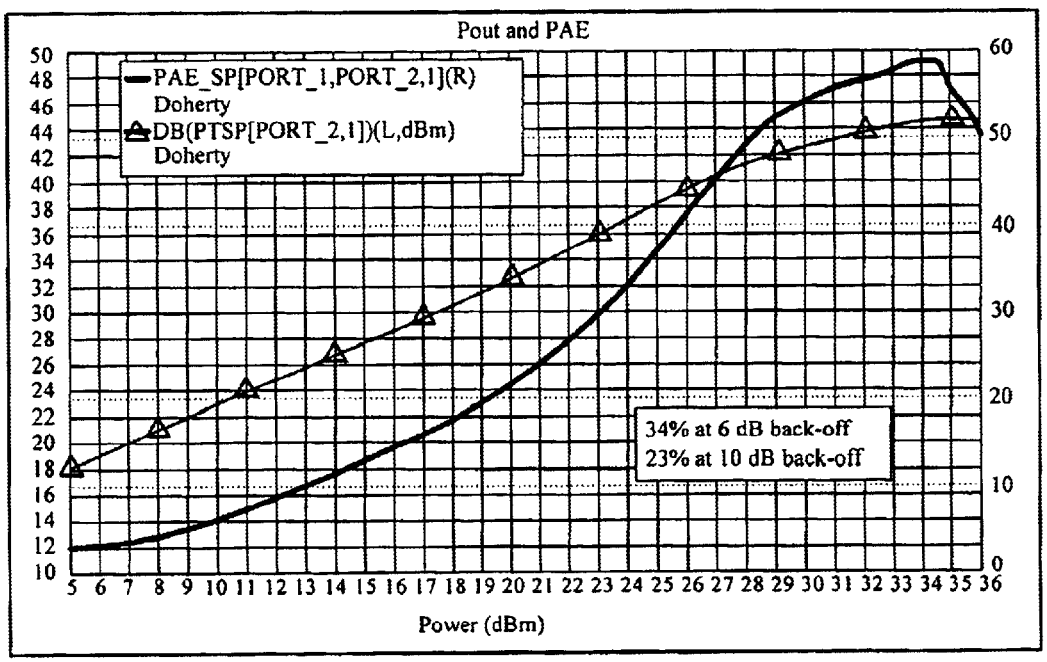
FIGS. 6A and 6B are plots of input power, output power, and PAE of the amplifier circuit of FIG. 5 before and after phase length optimization.
Figure 6B:
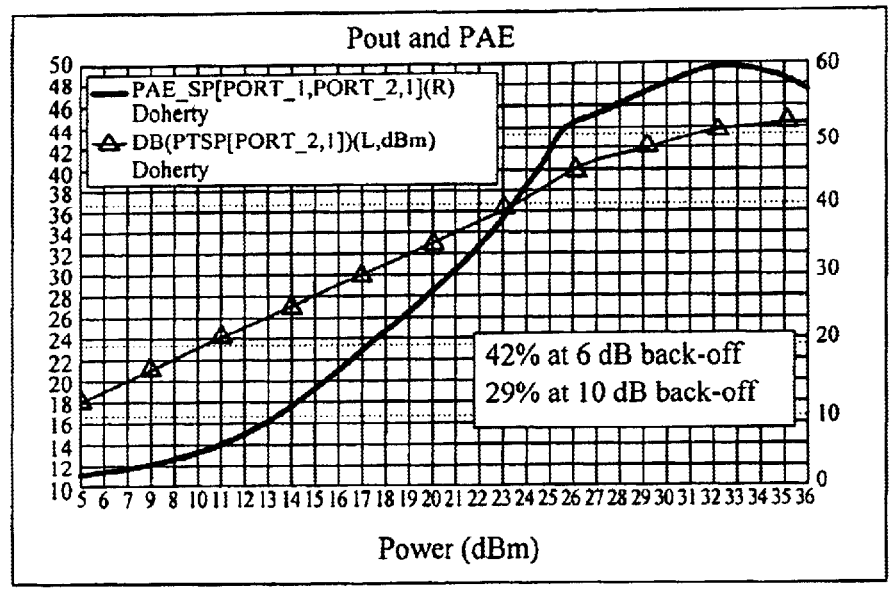

The amplifier of FIG. 5 was modified so that the carrier amplifier sees a 50 ohm termination at low RF power levels and the peak amplifier has an output impedance adjusted to 10 ohms. Measurements of power out and PAE before and after optimization of phase length are illustrated in FIGS. 6A and 6B, respectively. In FIG. 6A, before modification, the PAE at 6 dB back-off power was 34%, and at 10 dB, back-off power was 23%. After modification, as shown in FIG. 6B, the back-off power PAE at 6 dB increases to 42%, and at 10 dB back-off, the PAE increases to 29%.

Measured data taken on a 20 watt two-way Doherty amplifier module where output phase lengths were adjusted from 36 to 66 degrees at 2140 MHz are given in the following Table 2.

TABLE 2

| Phase Length, deg | Drain Efficiency @ 10 dB back-off, % | IM3 @ 2 W average two-tone, dBc |
|---|---|---|
| 36 | 22.0 | −33 |
| 46 | 24.0 | −37 |
| 56 | 24.5 | −43 |
| 66 | 24.5 | −50 |

In addition to the phase length effect on efficiency, lowering the output impedances to appropriate values and then transforming to 50 ohms after the combining node further increases operating effectiveness. Consider a 90 watt LDMOSFET Doherty amplifier with the gate matched to 50 ohms and the output drain being matched to 50 ohms, 17 ohms and 10 ohms, respectively.

Figure 7A:
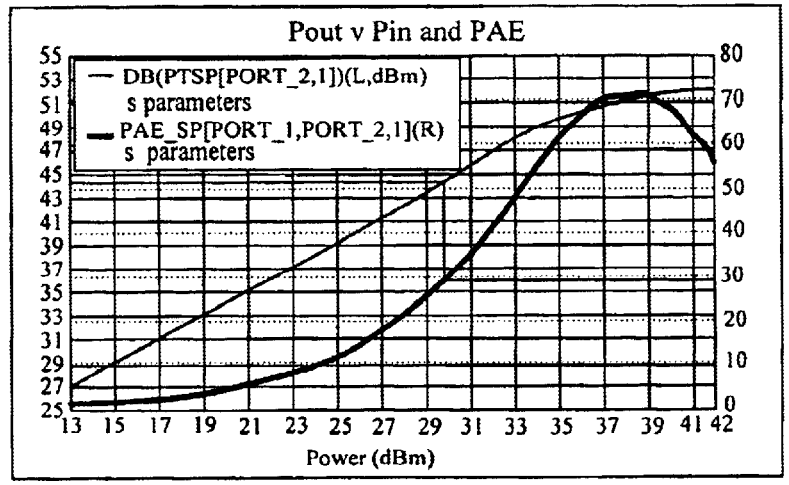
FIGS. 7A, 7B and 7C are plots of input power, output power and PAE for a 180 watt Doherty amplifier circuit with the amplifier outputs matched to 50 ohms, to 17 ohms, and to 10 ohms, respectively.

FIG. 7A is a graph illustrating performance of the 180 watt Doherty amplifier matched to 50 ohms. It will be noted that PAE at 7 dB back-off is 29%, and at 9 dB back-off is 20%. Effective Doherty operation is not realized with 50 ohm nominal output impedances in the carrier and peak amplifiers.

Figure 7B:
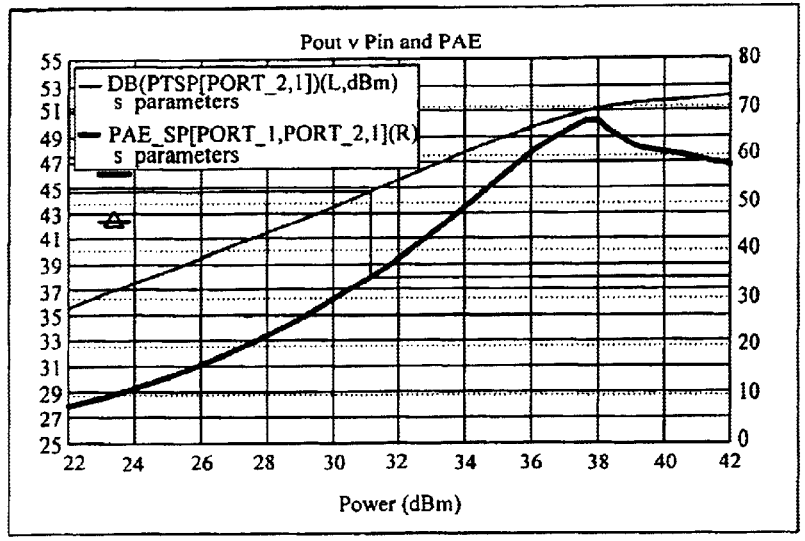

However, by matching the drains to 17 ohms impedance, as shown in FIG. 7B, the PAE is increased to 34% at 7 dB back-off, and increases to 25% at 9 dB back-off. Thus, PAE increases by approximately 5%, compared to the Doherty amplifier circuit matched to 50 ohms.

Figure 7C:
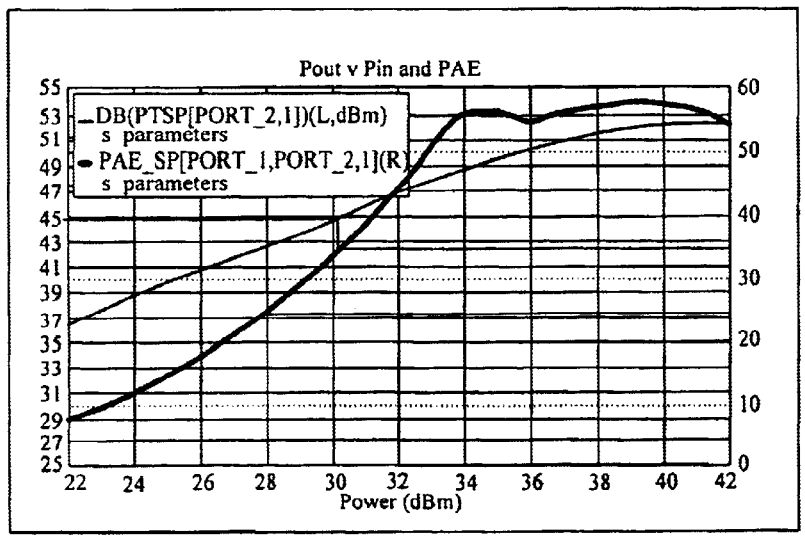

In FIG. 7C, for the performance of the Doherty amplifier circuit with a drain matched to 10 ohms impedance the PAE increases to 34% at 7 dB back-off, and increases to 27% at 9 dB back-off, thus showing stronger Doherty operation. At 9 dB back-off the PAE increases by 2%, compared to the Doherty amplifier circuit that was matched to 17 ohms.

The effect of output impedance on the Doherty amplifier circuit performance is illustrated in the following Table 3.

TABLE 3

| Configuration | Gain, dB | $P_{1dB}$, dBm | PAE @ 7 dB back-off, % | PAE @ 9 dB back-off, % |
|---|---|---|---|---|
| Conventional, 50 ohms | 13.5 | 52.5 | 21 | 16 |
| Doherty, 50 ohms | 14 | 51.2 | 29 | 20 |
| Doherty, 17 ohms | 13.5 | 52 | 34 | 25 |
| Doherty, 10 ohms | 14 | 51.5 | 34 | 27 |

Thus, it seen that each 90 watt single-ended amplifier is optimized for best output power and efficiency working into a 10 ohm characteristic impedance.

In accordance with the invention, effectiveness of a Doherty amplifier is increased by introducing additional phase lengths between the outputs of the amplifiers and the combiner node, and by reducing the individual load impedances of the carrier and peak amplifier, as well as the relative phases between them. The power amplifier output is then adjusted to 50 ohms after the combining node. Simulations indicate increased efficiency of over 25% when compared to a conventional Doherty approach, where phase and impedance optimization at the outputs of the carrier and peak amplifiers are not recognized and taken into account. The same design considerations can be used in the case of asymmetric Doherty amplifiers where the size of the RF transistors in the carrier and peak amplifiers are different. In all cases, optimization of load impedances and relative impedance phasing between the carrier and peak amplifier allows improvements in gain, efficiency and linearity of the complete power amplifier. While the invention has been described with reference to high power, high efficiency and high linearity RF and microwave amplifiers using silicon LDMOSFETs, the invention can be implemented using a wide range of semiconductor technologies such as silicon bipolar, gallium arsenide MESFET, indium gallium phosphide HBT, silicon carbide MESFET and gallium nitride HEMT.

While the invention has been described with reference to a specific four-way embodiment, the description is illustrative of the invention and is not to be construed as limiting the invention. Various modifications and applications may occur to those skilled in the art without departing from the true spirit and scope of the invention as defined by the appended claims.

What is claimed is:

1. An RF power amplifier circuit for optimally amplifying an RF signal over a broad range of power comprising:
    a) a carrier amplifier for amplifying the RF signal over a first range of power and with a power saturation level below the maximum of the broad range of power,
    b) a plurality of peak amplifiers connected in parallel with the carrier amplifier, each of the peak amplifiers being biased to sequentially provide an amplified output signal after the carrier amplifier approaches saturation,
    c) a signal splitter for splitting an input signal and applying the split input signal to the carrier amplifier and to the plurality of peak amplifiers, and
    d) an output for receiving and combining amplified output signals from the carrier amplifier and from the plurality of peak amplifiers, the output having an impedance, Z, the carrier amplifier and each of the peak amplifiers being connected to the output by individual output matching networks each presenting an optimized output impedance to an amplifier dependent on that network's impedance and effective phase length and differing from the impedance presented to other amplifiers.

2. The RF power amplifier circuit as defined by claim 1, wherein the phase lengths of each output matching network are selected to reduce reactance of the network output impedance for optimization.

3. The RF power amplifier circuit as defined by claim 1, wherein each peak amplifier extends efficient power amplification by 6 dB.

4. The RF power amplifier circuit as defined by claim 3, wherein the plurality of peak amplifiers is three peak amplifiers and the extended efficient power amplification is approximately 18 dB.

5. The RF power amplifier circuit as defined by claim 4, wherein each of the carrier amplifier and peak amplifiers comprises a lateral DMOS transistor.

6. The RF power amplifier circuit as defined by claim 1, wherein the signal splitter includes a quarter-wave transformer connected to the input of the carrier amplifier, and the output includes a resistive load connected to the output of the carrier amplifier and connected to the output of each peak amplifier through a quarter-wave transformer.

7. The RF power amplifier circuit as defined by claim 1, wherein each of the carrier amplifier and peak amplifiers comprises a transistor selected from the group consisting of lateral DMOS transistors, MESFETs, HEMTs, HBTs and bipolar transistors.

8. The RF power amplifier circuit as defined by claim 1, wherein the output includes a resistive load when connected to the output of the carrier amplifier and which is connected to the output of each peak amplifier through a quarter-wave transformer.

9. An RF power amplifier circuit for optimally amplifying an RF signal over a range of power, comprising:
    a) a carrier amplifier for amplifying the RF signal over a first range of power and with a power saturation level below the maximum of the range of power,
    b) at least one peak amplifier connected in parallel with the carrier amplifier, the peak amplifier being biased to provide an amplified output signal after the carrier amplifier approaches saturation, c) a signal splitter for splitting an input signal and applying the split input signal to the carrier amplifier and the at least one peak amplifier, d) an output combiner node coupled to a power amplifier output having an impedance, Z, and e) a plurality of output-matching networks connecting the carrier amplifier and the at least one peak amplifier to the output combiner node, each output-matching network presenting an output impedance to each amplifier of less than Z and individually optimized in phase and impedance to increase amplifier performance.

10. The RF power amplifier circuit as defined by claim 9, wherein the phase lengths of each output matching network are selected to reduce reactance of the output impedance.

11. The RF power amplifier circuit as defined by claim 9, further including an impedance transformer coupling the output combiner node to the power amplifier output for impedance transformation.

12. The RF power amplifier circuit as defined by claim 11, wherein each of the carrier amplifier and at least one peak amplifier comprises a transistor selected from the group consisting of lateral DMOS transistors, MESFETs, HEMTs, HBTs and bipolar transistors.

13. The RF power amplifier circuit as defined by claim 12, wherein the maximum RF output power is 180 watts.

* * * * *